United States Patent [19]

Rapoport et al.

[11] Patent Number: 5,298,687
[45] Date of Patent: Mar. 29, 1994

[54] HIGH-DENSITY MULTILAYER INTERCONNECTION SYSTEM ON A CERAMIC SUBSTRATE FOR HIGH CURRENT APPLICATIONS AND METHOD OF MANUFACTURE

[75] Inventors: Nahum Rapoport, Canton; Michael Curley, S. Lawrence, both of Mass.

[73] Assignee: Remtec, Inc., Norwood, Mass.

[21] Appl. No.: 43,990

[22] Filed: Apr. 7, 1993

Related U.S. Application Data

[63] Continuation of Ser. No. 634,382, Dec. 27, 1990.

[51] Int. Cl.$^5$ .............................................. H05K 1/00
[52] U.S. Cl. .................................. 174/261; 174/250; 174/256; 174/257; 29/831
[58] Field of Search ............... 174/250, 256, 257, 258, 174/261; 428/901; 156/902; 29/831, 840; 361/409, 410

[56] References Cited

U.S. PATENT DOCUMENTS

| | | | |
|---|---|---|---|
| 3,560,256 | 2/1971 | Abrams | 174/261 |
| 4,000,054 | 12/1976 | Marcantonio | 174/261 |
| 4,118,595 | 10/1978 | Pfahnl | 174/261 |
| 4,141,055 | 2/1979 | Berry | 174/261 |
| 4,440,823 | 4/1984 | Hoffmann | 174/257 |
| 4,522,888 | 6/1985 | Eichelberger et al. | 428/901 X |

OTHER PUBLICATIONS

*McGraw-Hill Dictionary of Scientific and Technical Terms*, Second Edition, McGraw-Hill, Inc. 1978, p. 530.

Muir, James and Janette R. Williams, "Copper Metallization of Conventional & Alternate Ceramics A New Concept for Today's Technology" ISHM '88 Proceedings, pp. 196-202.

Dekleva, T. W. and D. B. James, "High Density Electroplated Copper Circuitry Incorporating Air Firing Thick Film Resistors" ISHM '88 Proceedings, pp. 554-566.

Capp, Michael L. and Kalman Zsamboky, "Four Pure Cu Metallization Products, An Adhesion Value and Mechanism Comparison Study" ISHM '90 Proceedings, pp. 229-238.

Shawhan, Gary J. and Gary R. Sutcliffe, "Plated Copper Metallization For Power Hybrid Manufacture" Hybrid Circuit Technology, Apr. 1990.

Dickson, Joseph F. "Direct Bond Copper Technology: Materials, Methods, Applications" *The International Journal For Hybrid Microelectronics*, vol. 5, No. 2, Nov. 1982, pp. 103-109.

Kato, Kazuo, et al. "A New Insulated Metal Substrate With High Thermal Conductivity" Proceedings of the 1984 International Symposium on Microelectronics, Sep. 1984, pp. 252-258.

Fick, Herbert J. "PCB Materials For the '90s SMT Substrates For High Wattage Devices" SMTA Proceedings, 1990, pp. 588-594.

*Primary Examiner*—Leo P. Picard
*Assistant Examiner*—Cheryl R. Figlin

[57] ABSTRACT

High density/heavy current hybrid circuit on a ceramic substrate, or other insulating board material, includes first screen printed silver, or copper, polymer seed layer for basic circuitry and bus bar around this circuitry outside the scribe lines, which is connected by removable silver filled polymer links with the circuitry and also the circuit elements are connected with each other by the same links in order to provide uniform electroplating. The links are protected before electroplating with a removable plating resist and they are removed after electroplating using an appropriate stripping solution. Then a permanent plating resist and dielectric polymer thick film isolation layer are applied (for crossovers) on which the second seed layer is applied, plating of the second metal layer occurs and so on until the desired number of layers are done. Thus, cure temperature is that of polymerization, high density, good heat dissipation conditions, heavy current capacity in all the layers and low manufacturing costs are achieved.

6 Claims, 3 Drawing Sheets

HIGH-DENSITY MULTILAYER INTERCONNECTION SYSTEM ON A CERAMIC SUBSTRATE FOR HIGH CURRENT APPLICATIONS AND METHOD OF MANUFACTURE

This is a continuation of application Ser. No. 07/634,382, filed Dec. 27, 1990.

FIELD OF INVENTION

This invention relates generally to hybrid electrical interconnection crossover circuits and more particularly to a heavy-current, high-density hybrid interconnection crossover system using insulating substrate materials and polymer thick film materials and related processes, mainly for high power, low profile power electronic circuits and components.

BACKGROUND OF INVENTION

The current carrying capacity of conventional circuits employing hybrid technology is controlled by the thickness of the screened metal layers used therein and by the necessity of restricting the number of successively printed patterns due to material limitations. In order to improve the current handling capacity, some methods were developed in which a combination of thick film and copper plating techniques are used.

In general known methods for producing hybrid circuits capable of handling heavy currents employ three basic steps: (1) the application of a conductive seed layer using thick film screening techniques, usually noble metal based systems, or using thin film techniques, as by sputtering metal directly onto the ceramic or by ion implanting metal onto the ceramic; (2) copper plating of the seed layer; and (3) etching of the desired pattern using techniques similar to those used in the manufacturing of printed circuit boards.

In particular three methods used to implement such steps having a trade description are: ENPLATE (by Enthone, Inc. of West Haven, Conn.), CERACLAD (by Kollmorgan Corp. of Hicksville, N.Y.), and COPPER-ON-CERAMIC (by ICI of Los Angeles, Calif.). The differences between the above mentioned methods occur mainly in the seed layer material which is used. In all these techniques a substractive method (i.e. a method which requires the use of etching) is used to define the conductive traces, which method uses expensive materials (for the etching process) and extra labor (for the number of production steps). Moreover, such techniques do not provide for the possibility of creating high integration level, multilayer circuits, meaning that the density of the circuits is very low. Further the COPPER-ON-CERAMIC method provides crossovers with heavy current capacity on the top layer only. Theoretically it is possible to take these single layer technologies and create crossovers by using known methods developed for copper thick film technology using an oxygen doped nitrogen atmosphere. However, in practive it is too expensive a technique to use for such a purpose.

In conventional hybrid circuits for high current applications, one additional method is known, often referred to as the "successive prints" method. For such successive printing operations, a circuit must normally be realigned to the previously printed layer to within 0.002" or electrical shorting may occur between adjacent areas. This alignment accuracy tends to increase the cost of manufacture and further requires extra labor to be involved in the method as well.

Crossovers are also critical in heavy current high density hybrid circuits. To create conventional thick film crossovers for such circuits usually three structures are used: (1) a continuous screened conductor with a dielectric layer in between, (2) a structure in which one of the two crossed conductor lines is interrupted and then connected again with a wire above the other conductor (a so-called wire bonded crossover in which a dielectric encapsulation is usually placed underneath the bond to insulate the wire bond from the conductor being crossed); and (3) a structure which is the same as structure (2) but where, instead of a wire, a copper bar is used to connect the interrupted conductor line.

The state-of-the-art structures (1) and (2) can be fabricated by taking advantage of semi-automated techniques for low cost production but they do not provide a low enough resistance in the crossovers for heavy currents. Structure (3) provides the low resistance needed but at the expense of decreased circuit density, lower system reliability, inferior heat dissipation characteristics, and higher production costs.

It is desirable to provide heavy current/high density hybrid circuits using ceramic technology in order to provide an additional improved method of manufacture which maintains both a low material cost and a low labor cost. It is also desirable for such circuits to have low profile crossovers with good heat dissipation characteristics.

SUMMARY OF INVENTION

The invention disclosed herein is a heavy current/high density interconnection system placed on a ceramic substrate, or other insulating board material. In accordance therewith the system comprises a ceramic substrate with a first metal seed layer of a commercially available silver, or copper, filled conductive polymer layer which is screen printed on the ceramic substrate using standard screen printing techniques. The structure is cured, as in a forced air convection box oven with the basic circuit pattern and a removable bus bar, the bus bar being used for connection to the current source in a plating operation and for better control over the copper plating level and being located around and enclosing the said circuit pattern (but outside the scribe lines of commercially available substrate materials). Also screen printed on said ceramic substrate, along with the basic circuit pattern, is a commercially available silver filled polymer conductor, removable with a strong basic (i.e. high pH) solution using an ultrasonic agitation technique, providing links interconnecting all the circuit pattern areas to be plated with each other and the bus bar in order to create a closed loop circuit for uniform electroplating. A commercially available UV cured plating resist, removable with a strong basic (i.e. high pH) solution, is also screen printed over the interconnecting links to protect the silver filled polymer. A permanent polyimid filled polymer dielectric solder mask and plating resist material, which has been temperature cured in a forced air convection box oven, is printed over those circuit areas where no plating is to occur. Exposed areas of said silver filled polymer seed layer are electroplated with a thick copper plated metal layer for heavy currents. Successive copper plated layers are obtained by screen printing polyimid filled polymer dielectric layers, located in areas of layer-to-layer isolation, where the number of layers printed is defined by the layer-to-layer voltage isolation and the plated copper thickness. A screen printed second seed layer of temperature cured silver filled conductive polymer in a predetermined pattern is used for the next electroplated layer build-up.

Compared with traditional heavy current, high density hybrid circuits, the present invention offers the possibility of using a relatively inexpensive technique for providing a crossover connection with a profile height which is an order of magnitude less than that found in the aforementioned state-of-the-art circuits. Further, the invention provides much better heat dissipation within the cross-over area than that provided using existing techniques and makes possible the creation of heavy current conductors for any level of crossovers. Further, the technique of the invention uses low cure temperatures for polymer printing, thus eliminating the need for complex atmosphere control to limit the bulk oxidation of the copper traces.

DETAILED DESCRIPTION OF THE PREFERRED EMBODIMENT

Figure 1:
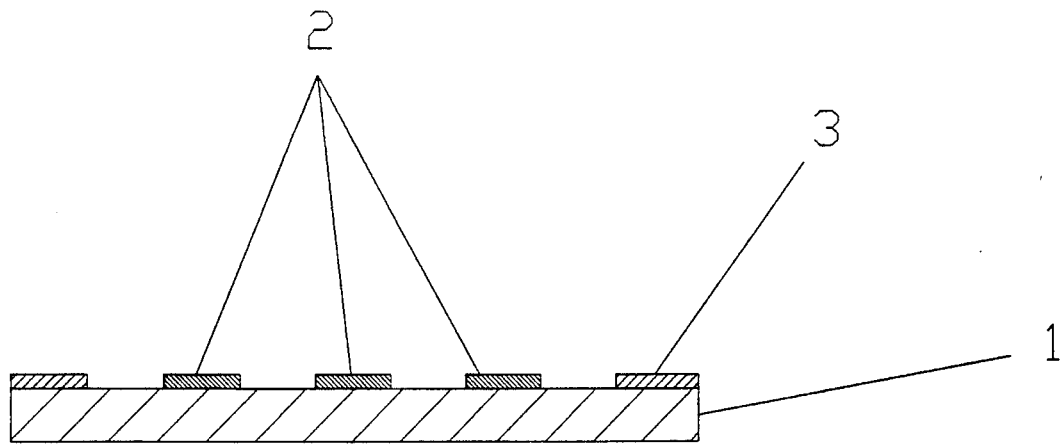
FIG. 1 shows an isometric view of ceramic substrate with a screen printed first metal layer (base circuit and removable bus bar)

Referring to the drawings, FIG. 1 shows a ceramic substrate 1 with a screen printed first metal seed layer thereon. Such a layer is printed using standard screen printing techniques to apply a silver, or copper, filled conductive polymer, using a stainless steel mesh screen with an emulsion thickness of 0.0006", to form the basic circuit pattern 2 and bus bar 3 for defining the copper plated areas to be constructed, as well as defining the connection point for a current source during the subsequent copper plating operation. After printing, the seed layer comprising the circuit pattern 2 and the bus bar 3 is cured in a forced air convection box oven at, for example, 165° C. for 30 minutes.

Figure 2:
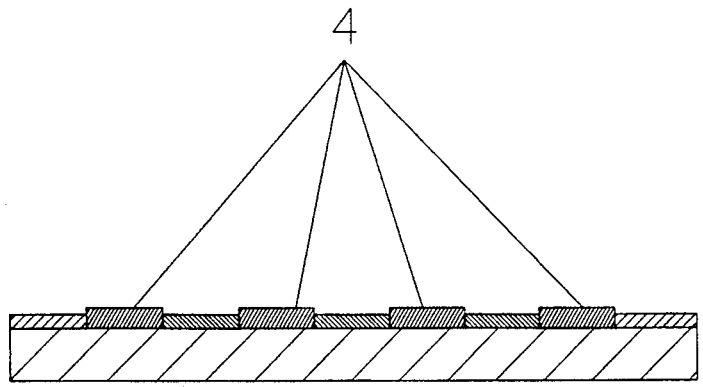
FIG. 2 shows the substrate of FIG. 1 with silver filled polymer links added.

FIG. 2 shows screen printed silver filled conductive polymer links 4, linking the basic circuit pattern and bus bar, such links being removable with a high pH solution such as 1 Normal Sodium Hydroxide (NaOH) solution using ultrasonic agitation, for example. Such links interconnect all the circuit areas 2 which will be copper plated with each other and with the bus bar 3 in order to create a closed loop circuit for the copper electroplating process. After printing, the links 4 are cured at, for example, 150° C. for 10 minutes.

Figure 3:
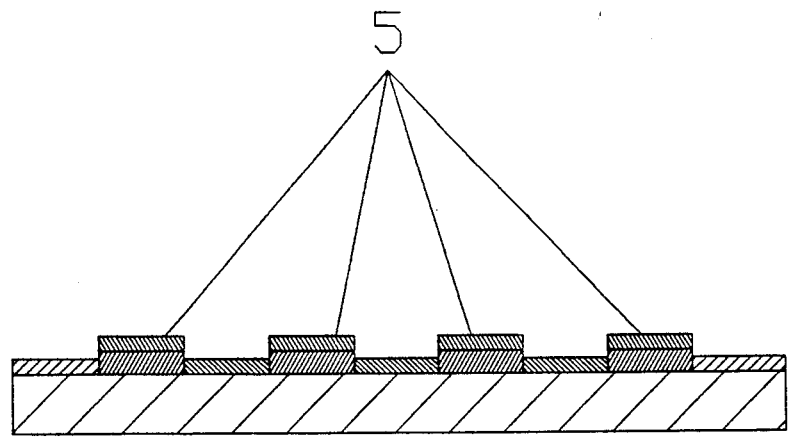
FIG. 3 shows the substrate of FIG. 2 with screen printed removable plating resist added.

FIG. 3 shows a screen printed UV cured plating resist 5, removable with a high pH solution such as 1 Normal Sodium Hydroxide (NaOH), which is used to protect the silver filled conductive polymer links from the copper plating operation, thus making the links easier to remove. The removable plating resist 5 is cured under a 200 Watt UV source, for example, for 30 seconds.

Figure 4:
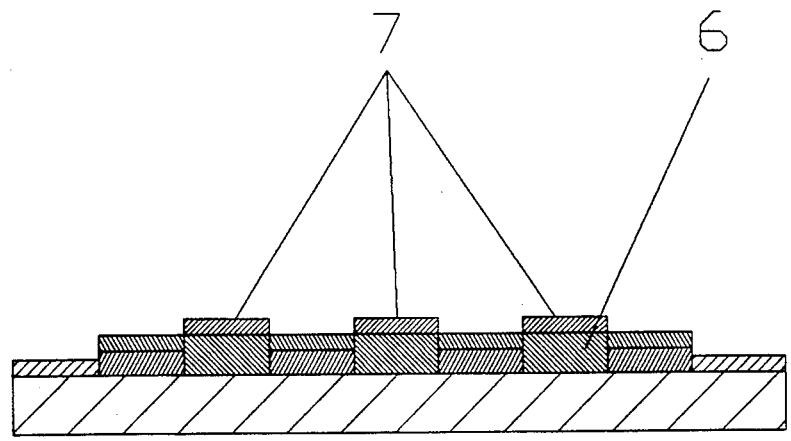
FIG. 4 shows the substrate of FIG. 3 after electroplating with permanent plating resist has been added.

FIG. 4 shows a first metal seed layer after copper electroplating with thick copper traces 6, using a standard copper sulfate plating bath with commercially available plating additives to control plating, to provide an even leveling thereof, and to limit organic entrapment within the copper plating. After plating, a polyimid filled polymer dielectric material is screen printed on selective areas of the circuit and used as a permanent plating resist 7. After such printing, the permanent plating resist is cured in the forced air convection box oven at, for example, 165° C. for 30 minutes.

Figure 5:
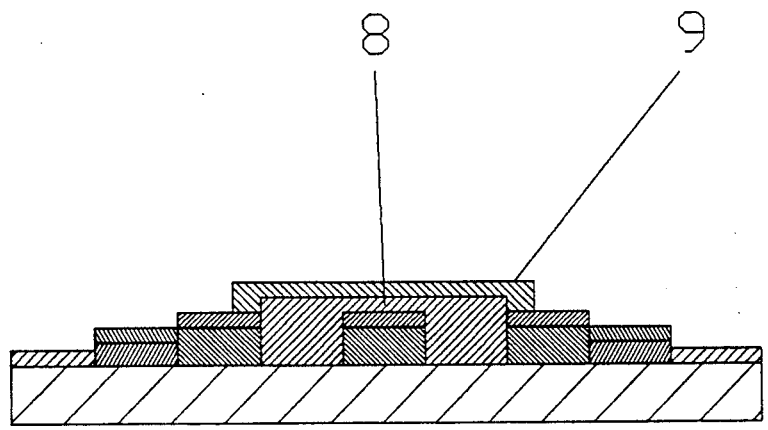
FIG. 5 shows the substrate of FIG. 4 with a screen printed polymer isolation layer and a screen printed second silver seed layer added.

FIG. 5 shows a plated copper hybrid circuit of the invention after screen printing the polyimid filled dielectric polymer isolation layer 8 and after a second silver or copper filled conductive polymer seed layer 9 has been applied. After such printing, the polymer dielectric isolation layer 8 and the second seed layer 9 are cured in the forced air convection box oven at, for example, 165° C. for 30 minutes.

Figure 6:
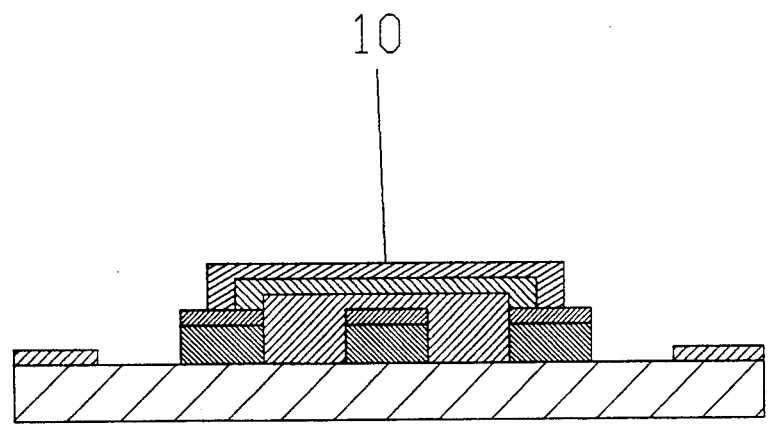
FIG. 6 shows the substrate of FIG. 5 after electroplating a second seed layer after the links and plating resist are removed.

FIG. 6 shows the circuit after the second seed layer 9 has been electroplated with thick copper traces 10, using a standard copper sulfate plating bath with commercially available plating additives to control plating level and to limit organic entrapment within the copper plating, and after the silver filled polymer links 4 (FIG. 2) and the removable plating resist 5 (FIG. 3) have been stripped from the substrate using a 1 Normal Sodium Hydroxide (NaOH) solution using ultrasonic agitation. The conductive polymer layer 9 and the copper traces 10 plated thereon overlie the isolation layer 8 and are in direct and intimate contact with it.

In accordance with the invention, a conventional electroplating method is applicable. For such a purpose, the circuit is attached to the plating rack connections by the bus bar 3 and a current of 15–20 Amps per square foot is applied. Commonly available plating additives, to control the plating level and to limit organic entrapment within the copper build-up, are employed in the standard copper sulfate plating operation. Copper build-up is a function of the current density and the time within the plating baths. Standard processing controls employed in copper plating operations are required.

To remove the UV cured plating resist 5 (removal takes place after electroplating) and the silver filled conductive polymer links 4 (also after electroplating), a 1 Normal Sodium Hydroxide solution using ultrasonic agitation for 2–4 minutes is used.

Thus, the technique of the invention can be summarized as follows: a silver or copper filled conductive polymer seed layer forming a basic circuit 2 and a bus bar 3 around the circuit is applied using thick film screen printing methods. The bus bar 3 is printed, for example, outside the scribe lines of a commercially available ceramic substrate. The bus bar will ultimately be removed, together with the ceramic outside the scribe line, as the last step of circuit manufacture. Removable silver filled conductive polymer links 4 are then formed by using the same screen printing methods. Bus bar 3, basic circuit 2, and links 4 form an electrically closed loop for uniform copper electroplating.

After forced air convection curing of the various layers, a UV cured removable plating resist 5 is screen printed to protect the removable silver filled conductive polymer links 4. All of these operations require some control over alignment, but with a relatively low degree of accuracy than in prior used techniques and are, therefore, relatively inexpensive to implement (the UV cured plating resist and the polyimid filled dielectric polymer solder mask and permanent plating resist are to protect selected portions of the circuitry from being plated) compared to the accuracy required for the successive printing technique described in such previously used techniques. The UV cured removable plating resist 5 is cured prior to the copper plating operation.

The plating operation then used in the next step of the technique of the invention produces a thick, uniform foil of metal (i.e. copper) 6 because prior to this step the closed loop is already formed with the help of the links 4, bus bar 3, and the elements of the basic circuitry 2.

After plating the first layer, the polyimid filled dielectric polymer solder mask and permanent plating resist 7 is applied using screen printing techniques to prevent any additional plating when the second metal seed layer is subsequently plated.

After forced air convection curing of the dielectric polymer, the next step is to screen print polymer isolation layer 8 and, after its cure, the second silver or copper filled conductive polymer seed layer 9. Then the second seed layer 9 is again copper electroplated to produce thick copper traces 10 which act as the second circuit layer. All of the above described steps can be repeated for any number of successive layers if needed.

Based on the description and drawings of the invention presented, it can be seen that the invention employs what can be termed an additive technique in which every element of a circuit is added and only auxiliary links and protecting layers are removed. Also removable is the bus bar, which is located in an area outside of the substrate scribe lines, such an area being one that would be removed anyway in the technique used, since designers of substrates intend such an area to be removed as part of the final substrate trim, although in some applications one could retain it if needed.

It can also be seen that there are no air gaps present between layers when using the proposed technique. Such a structure results in the best possible heat dissipation conditions within the high current crossover region and one which is significantly better than structures having crossovers made with the help of discretely secured circuit elements.

However, the technique of the invention does not use the high temperatures required in traditional thick film techniques, but rather needs only polymer cure temperatures. It is well known that the temperatures of polymerization are 4–5 times lower when compared to the temperatures used for thick film or direct bond copper thermal treatments. The possibility of a low temperature cure gives higher reliability to the circuit, i.e. less probability of defects associated with high temperatures, and reduces the cost of manufacture because less energy is consumed and because the ovens are less expensive.

The crossovers formed according to the invention could also be made using relatively large cross sectional areas on both levels, if needed. Because of the dense packaging of the circuit, the height of its profile could be less than 0.010" (compared to 0.100" for a conventional crossover of the same current capacity) so that the invention can provide a high density circuit.

Because in the proposed circuit there are no discrete elements in the crossovers the labor cost is also much lower compared to traditional crossover formation techniques.

A specific example representing a preferred embodiment of a structure and technique of the invention is set forth below:

1. Using standard setup and printing techniques found within the industry on a MPM TF-100 Thick Film Screen Printer and IRI 325 mesh Stainless Steel weave screen, 0.0011" diameter wire set at 45° angle relative to 8"×10" aluminum frame, with 0.0006" HP emulsion, a first metal seed layer is printed on a laser scribed 96% Alumina ceramic to a wet thickness of 0.0012" (approximately 20 microns) such that the pattern is correctly aligned within the laser scribe lines of the ceramic substrate and the attached bus bar.

2. A silver filled polymer is cured in a Blue M Stabil-Therm Forced Convection drying oven at 165° C. for 30 minutes. The dry thickness of the silver filled polymer is approximately 0.0011".

3. Using standard setup and printing techniques found within the industry on a MPM TF-100 Thick Film Screen Printer and IRI 325 mesh Stainless Steel weave screen, 0.0011" diameter wire set at 45° angle relative to 8"×10" aluminum frame, with 0.0006" HP emulsion, the first removable interconnection system is printed with removable silver filled conductive polymer on the laser scribed 96% Alumina ceramic to a wet thickness of 0.0008" (approximately 20 microns) such that the pattern is correctly oriented relative to the first metal seed layer.

4. The removable silver filled polymer is cured in a Blue M Stabil-Therm Forced Convection drying oven at 150° C. for 10 minutes. Dry thickness of the removable silver filled polymer is approximately 0.0007".

5. Using standard setup and printing techniques found within the industry on a MPM TF-100 Thick Film Screen Printer and IRI 230 mesh Stainless Steel weave, 0.0014" diameter wire set at 45° angle relative to 8"×10" aluminum frame, with 0.0006" HP emulsion, the removable plating resist system is printed with Enthone ENPLATE UR-462B UV cured plating resist over the removable silver filled conductive polymer links to a wet thickness of 0.001" (approximately 25 microns) such that the material completely covers the removable links except at the interface between the first metal layer seed layer and the removable links.

6. The removable UV cured plating resist is cured in an American Ultraviolet Company Mini Conveyorized Curing System, setup such that the units are exposed to a total of 200 W of UV energy.

7. The ceramic substrates are then clipped to a spring loaded plating rack and the electrical contact is tested prior to application of current from the power supply. After connections are tested, a current density of 15-20 Amps per square foot of board area which is being copper plated is applied thereto.

8. After the power supply is setup and activated, the plating racks are immersed into a standard copper sulfate plating solution with Harshaw CP-1 copper plating additives. Standard processes used in copper plating technology controls are implemented and monitored. A standard copper thickness of 3 ounces is achieved in one (1) to two (2) hours.

9. After copper plating, the units are cleaned in deionized water and forced dried to remove excess water. The units are detached from the plating racks.

10. Using standard setup and printing techniques found within the industry on a MPM TF-100 Thick Film Screen Printer and IRI 325 mesh Stainless Steel weave screen, 0.0011" diameter wire set at 45° angle relative to 8"×10" aluminum frame, with 0.0006" HP emulsion, the polyimid filled dielectric polymer is printed over the areas of the circuit where permanent plating resist or solder mask is required to a wet thickness of 0.0015" (approximately 38 microns).

11. The dielectric polymer is cured in a Blue M Stabil-Therm Forced Convection drying oven at 165° C. for 30 minutes. Dry thickness of the dielectric polymer is approximately 0.0012".

12. Using standard setup and printing techniques found within the industry on a MPM TF-100 Thick Film Screen Printer and IRI 325 mesh Stainless Steel weave screen, 0.0011" diameter wire set at 45° angle relative to 8"×10" aluminum frame, with 0.0006" HP emulsion, the polyimid filled dielectric polymer is printed over the copper traces which are isolated from second metal layer to a wet thickness of 0.0015" (approximately 38 microns). This process of printing and curing is repeated for at least two layers, or to meet the voltage requirements of the circuit.

13. The dielectric polymer is cured in a Blue M Stabil-Therm Forced Convection drying oven at 165° C. for 30 minutes. Dry thickness of the dielectric polymer is approximately 0.0012".

14. Using standard setup and printing techniques found within the industry on a MPM TF-100 Thick Film Screen Printer and IRI 325 mesh Stainless Steel weave screen, 0.0011" diameter wire set at 45° angle relative to 8"×10" aluminum frame, with 0.0006" HP emulsion, the second metal seed layer is printed on the polyimid filled dielectric polymer to a wet thickness of 0.0008" (approximately 20 microns) such that the pattern is correctly aligned to the first plated pattern.

15. The silver filled polymer is cured in a Blue M Stabil-Therm Forced Convection drying oven at 165° C. for 30 minutes. Dry thickness of the silver filled polymer is approximately 0.0007" thickness of the silver filled polymer is approximately 0.0007".

16. The ceramic substrates are then clipped to a loaded plating rack and the electrical contact is tested prior application of current from the power supply. After are tested, a current density of 15-20 Amps per board area which is being copper plated is applied thereto.

17. After the power supply is setup and activated, plating racks are immersed into a standard copper sulfate solution with Harshaw CP-1 copper plating additives. process used in copper plating technology controls are and monitored. A standard copper thickness of 3 ounces achieved in one (1) to two (2) hours.

18. After copper plating, the units are cleaned in water and forced dried to remove excess water. The units are detached from the plating racks.

19. The UV cured removable plating resist and the filled removable conductive links are stripped in a 1 Sodium Hydroxide solution (NaOH) in a Cole Parmer Heavy Duty Ultrasonic Cleaner for 2-3 minutes. After stripping immersed in a de-ionized water bath to neutralize the basic solution.

20. Steps 3 through 18 can be repeated plating layer required for the circuitry.

It is understood that the specific concepts and implementation of the invention herein described, can be in different ways, as by using different materials, different temperatures and times of curing, and a different order of the operations involved. Thus, it is intended that hybrid that are equivalent to those described herein and any that is used in substantially the same way to achieve the same result are considered to be within the scope of the present invention. Hence, the invention is not to be construed as to the specific embodiments described except as defined in the appended claims.

We claim:

1. A high-density multilayer interconnection system
    (a) an insulative substrate;
    (b) a first layer circuit pattern having at least three conductive lines each of which consists of a seed and a plated portion, wherein said seed portion is a metal filled polymer material printed on the surface of said insulative substrate, said plated portion is an electroplated metal on surface of portion, provided that the cross-sectional area of the said portion is sufficient to achieve a standard copper thickness ounces within a reasonable time period (approximately two using a standard state-of-the-art plating process;
    (c) an insulative isolation layer being positioned between at least two conductive lines and overlaying said at least one conductive line of said circuit pattern, wherein said is a low temperature polyimide or an epoxy based dielectric of less than 0.007 inches and exhibiting characteristics resistant to an electrodeposited process;
    (d) second layer circuit pattern having at least one line consisting of said seed and plated portions wherein said portion is printed on surface of said insulative isolation between said at least two conductive lines of said first said plated portion of said second layer conductive line is electroplated on the surface of said seed portion with both said plated portion being extended on the surface of said at two conductive lines, provided that a cross-section area of second layer seed and plated portions is the same as first layer.

2. A high density multilayer interconnection system claim 1, wherein each said conductive line of every having said seed and plated portions, provided that a defined area of each said seed and plated portion is the same as that of said first or said second layer conductive line portion, plated portion of each said conductive line is electroplated seed portion of said line, and in between every two adjacent being positioned said insulative isolation layer.

3. A process for providing an interconnection crossover circuit system comprising the steps
    forming circuit elements of a first layer circuit pattern a selected region of a surface of an insulative substrate additive screen printing techniques to provide defined circuit elements of said first layer circuit pattern;
    forming a conductive bus bar enclosing said circuit on said substrate surface and outside said selected region thereof;
    forming conductive connections on said substrate surface between the circuit elements of said first layer circuit and between said circuit pattern and said bus bar to produce a closed loop circuit thereof;
    forming a first layer of plating resist material on said conductive connections;
    electroplating regions of said first layer circuit pattern by plating a metallic material where no plating resist is on said circuit pattern;
    removing said first layer of plating resist conductive connections between said circuit pattern and said bar;

forming an isolation layer of dielectric material in the region between at least two conductive portions of said first layer circuit pattern which are to be interconnected, said of dielectric material being formed to overlie at least one conductive portion of said first layer circuit pattern present the region between said at least two conductive portions;

forming at least one interconnecting layer of conductive material using additive screen printing techniques form a second layer circuit pattern having defined additional circuit elements, said second layer conductive material between and interconnecting said at least two conductive portions, said second layer conductive material comprising a metal filled polymer layer overlaid with a metallic material, said interconnecting layer overlying said isolation layer of dielectric material in direct and intimate contact therewith;

forming conductive connections on said dielectric surface between the additional circuit elements of said second layer circuit pattern and said bus bar to produce a closed loop thereof;

forming a second layer of plating resist material on said conductive connections;

electroplating regions of said second layer circuit by plating a metallic material on said additional defined elements;

removing said second layer of plating resist material and the conductive connections between said circuit pattern and said bus bar.

4. A process in accordance with claim 3 wherein the electroplating of said first and second layer circuit patterns includes placing said substrate in a metal plating solution; and connecting a current source to said bus bar for supplying current at a selected current level to said closed loop 5. A process in accordance with claim 3 wherein said plating step comprises the plating of successive layers said metal plating material on to said metal filled polymer so to provide an overall plating layer having a selected 6. A process in accordance with claim 3 and further including removing the portion of the substrate containing bus bar from said substrate to provide a substrate having said circuit pattern with said at least one crossover thereon. n

* * * * *